United States Patent
Lipson et al.

(10) Patent No.: US 11,988,971 B2
(45) Date of Patent: May 21, 2024

(54) LITHOGRAPHIC APPARATUS, SUBSTRATE TABLE, AND METHOD

(71) Applicants: ASML HOLDING N.V., Veldhoven (NL); ASML NETHERLANDS B.V., Veldhoven (NL)

(72) Inventors: Matthew Lipson, Stamford, CT (US); Satish Achanta, Leuven (BE); Benjamin David Dawson, Trumbull, CT (US); Matthew Anthony Sorna, Washington, DC (US); Iliya Sigal, Stamford, CT (US); Tammo Uitterdijk, Wilton, CT (US)

(73) Assignees: ASML HOLDING N.V., Veldhoven (NL); ASML NETHERLANDS B.V., Veldhoven (NL)

( * ) Notice: Subject to any disclaimer, the term of this patent is extended or adjusted under 35 U.S.C. 154(b) by 34 days.

(21) Appl. No.: 17/612,679

(22) PCT Filed: May 5, 2020

(86) PCT No.: PCT/EP2020/062463
§ 371 (c)(1),
(2) Date: Nov. 19, 2021

(87) PCT Pub. No.: WO2020/239373
PCT Pub. Date: Dec. 3, 2020

(65) Prior Publication Data
US 2022/0082953 A1 Mar. 17, 2022

Related U.S. Application Data

(60) Provisional application No. 62/852,578, filed on May 24, 2019.

(51) Int. Cl.
*G03F 7/00* (2006.01)

(52) U.S. Cl.
CPC .............................. *G03F 7/70716* (2013.01)

(58) Field of Classification Search
CPC .... G03F 7/70341; G03F 7/20; G03F 7/70416; G03F 7/707; G03F 7/70708;
(Continued)

(56) References Cited

U.S. PATENT DOCUMENTS 7,511,799 B2 3/2009 Tel et al.
7,816,022 B2 * 10/2010 Ekstein .................. G03F 7/707
428/457

(Continued)

FOREIGN PATENT DOCUMENTS

CN 1614515 5/2005
EP 1491962 12/2004
(Continued)

OTHER PUBLICATIONS

International Search Report and Written Opinion issued in corresponding PCT Patent Application No. PCT/EP2020/062463, dated Aug. 3, 2020.

(Continued)

*Primary Examiner* — Hung V Nguyen
(74) *Attorney, Agent, or Firm* — Pillsbury Winthrop Shaw Pittman, LLP (57) ABSTRACT

A substrate table for supporting a substrate includes a surface and coarse burls. Each of the coarse burls includes a burl-top surface and fine burls. The coarse burls are disposed on the surface of the substrate table. The fine burls are disposed on the burl-top surface. The fine burls contact the substrate when the substrate table supports the substrate.

20 Claims, 8 Drawing Sheets

(58) Field of Classification Search
CPC .. G03F 7/70716; G03F 7/70733; G03F 7/708; B05D 3/06; B05D 5/00; B22F 7/062; B22F 10/25; B22F 10/28; B22F 10/66; B23Q 3/18; Y02P 10/25
See application file for complete search history.

(56) References Cited

U.S. PATENT DOCUMENTS

| | | | |
|---|---|---|---|
| 8,318,288 B2 | 11/2012 | Bakker | |
| 9,737,934 B2* | 8/2017 | Lafarre | G03F 7/70733 |
| 10,018,924 B2 | 7/2018 | Lafarre et al. | |
| 10,241,418 B2 | 3/2019 | Hauptmann et al. | |
| 10,453,734 B2 | 10/2019 | Poiesz et al. | |
| 2005/0024620 A1 | 2/2005 | Van Empel et al. | |
| 2006/0006340 A1 | 1/2006 | Compen | |
| 2007/0217114 A1* | 9/2007 | Sasaki | C23C 16/4581 361/145 |
| 2008/0138504 A1* | 6/2008 | Williams | C23C 14/048 118/500 |
| 2008/0158538 A1 | 7/2008 | Puyt et al. | |
| 2009/0079525 A1 | 3/2009 | Sijben | |
| 2013/0301028 A1 | 11/2013 | Albert et al. | |
| 2013/0308116 A1 | 11/2013 | Helmus et al. | |
| 2015/0124234 A1 | 5/2015 | Lafarre et al. | |
| 2016/0036355 A1 | 2/2016 | Moriya et al. | |
| 2018/0190534 A1 | 7/2018 | Poiesz et al. | |

FOREIGN PATENT DOCUMENTS

| | | |
|---|---|---|
| JP | 2005019993 | 1/2005 |
| JP | 2007207842 | 8/2007 |
| JP | 2010515258 | 5/2010 |
| TW | 200929429 | 7/2009 |
| TW | 201232696 | 8/2012 |
| TW | 201241578 | 10/2012 |
| TW | 201348892 | 12/2013 |
| TW | 201621472 | 6/2016 |
| TW | 201704894 | 2/2017 |
| WO | 2014156619 | 10/2014 |
| WO | 2017001135 | 1/2017 |
| WO | 2019096554 | 5/2019 |

OTHER PUBLICATIONS

Office Action issued in corresponding Chinese Patent Application No. 202080038409.6, dated Dec. 25, 2023.
Office Action issued in corresponding Japanese Patent Application No. 2021-564276, dated Mar. 29, 2024.

* cited by examiner

LITHOGRAPHIC APPARATUS, SUBSTRATE TABLE, AND METHOD

CROSS-REFERENCE TO RELATED APPLICATIONS

This application is the U.S. national phase entry of PCT Patent Application No. PCT/EP2020/062463, which was filed on May 5, 2020, which claims the benefit of priority of U.S. Provisional Patent Application No. 62/852,578, which was filed on May 24, 2019, each of which is incorporated herein in its entirety by reference.

FIELD

The present disclosure relates to substrate tables, textured table surfaces, and methods of employing burls and nanostructures on substrate table surfaces.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

It is desirable to dictate and maintain tribological properties (e.g., friction, hardness, wear) on a surface of a substrate table. A substrate table has a surface level tolerance that can be difficult to meet because of precision requirements of lithographic and metrology processes. Wafers (e.g., semiconductor substrate), being relatively thin (e.g., <1 mm thick) compared to a width of its surface area (e.g., >100 mm), are particularly sensitive to unevenness of the substrate table. Additionally, ultra-smooth surfaces in contact may become "stuck" together, which may present a problem when a substrate must be disengaged from the substrate table. It is desirable to develop structures and methods for substrate tables that allow increased wear resistance and frictional properties that are conducive to engaging and disengaging a substrate when commanded.

SUMMARY

In some embodiments, a substrate table for supporting a substrate comprises a surface and coarse burls. Each of the coarse burls comprises a burl-top surface and fine burls. The coarse burls are disposed on the surface of the substrate table. The fine burls are disposed on the burl-top surface and are configured to contact the substrate when the substrate table supports the substrate.

In some embodiments, a lithographic apparatus comprises an illumination system, a support, a projection system, and a substrate table. The substrate table comprises a surface and coarse burls. Each of the coarse burls comprises a burl-top surface and fine burls. The coarse burls are disposed on the surface of the substrate table. The fine burls are disposed on the burl-top surface and are configured to contact a substrate when the substrate table supports the substrate. The illumination system is configured to produce a beam of radiation. The support is configured to support a patterning device to impart a pattern on the beam. The projection system is configured to project the patterned beam onto the substrate.

In some embodiments, a method for fabricating a substrate table comprises supporting the substrate table to receive fabrication processes and fabricating coarse burls and fine burls on the substrate table. Fabricating the coarse burls and the fine burls comprises disposing the fine burls on burl-top surfaces of the coarse burls.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" or the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Before describing such embodiments in more detail, however, it is instructive to present an example environment in which embodiments of the present disclosure can be implemented.

Example Lithographic Systems

Figure 1A:
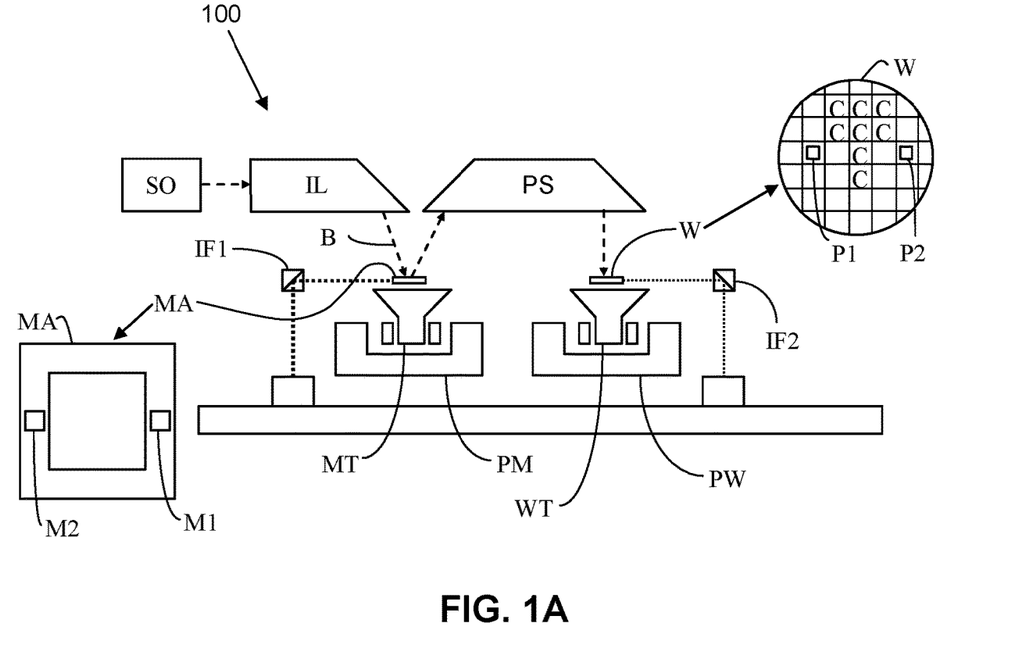
FIG. 1A shows a schematic of a reflective lithographic apparatus, according to some embodiments.
Figure 1B:
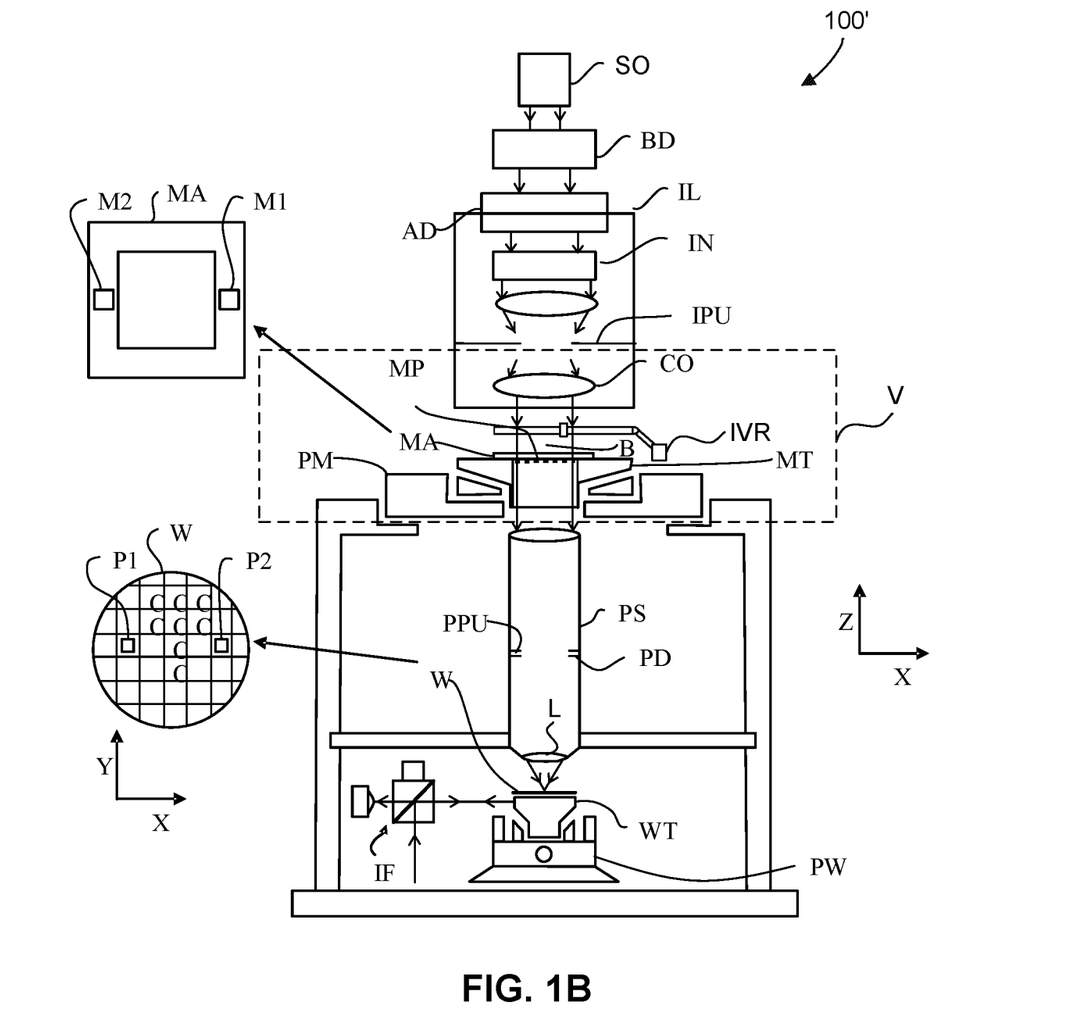
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA.

The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots should be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
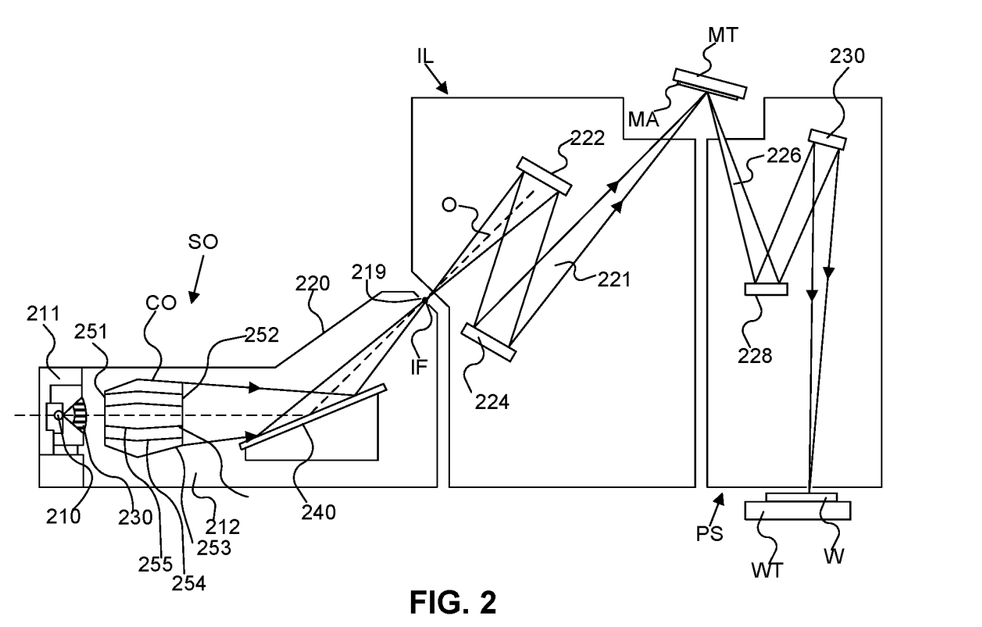
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap 230 (or contaminant barrier) further indicated herein at least includes a channel structure.

The collector chamber 212 can include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of beam of radiation 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the FIG. 2, for example there can be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
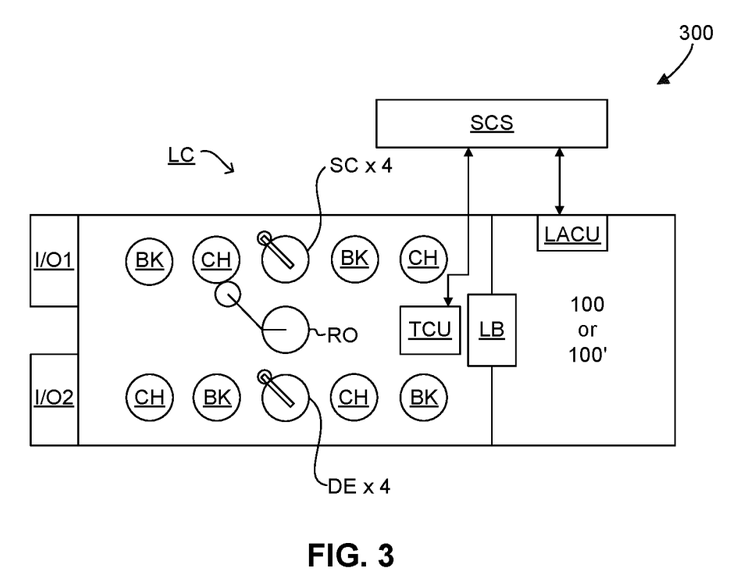
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' can form part of lithographic cell 300. Lithographic cell 300 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Exemplary Substrate Table

Figure 4:
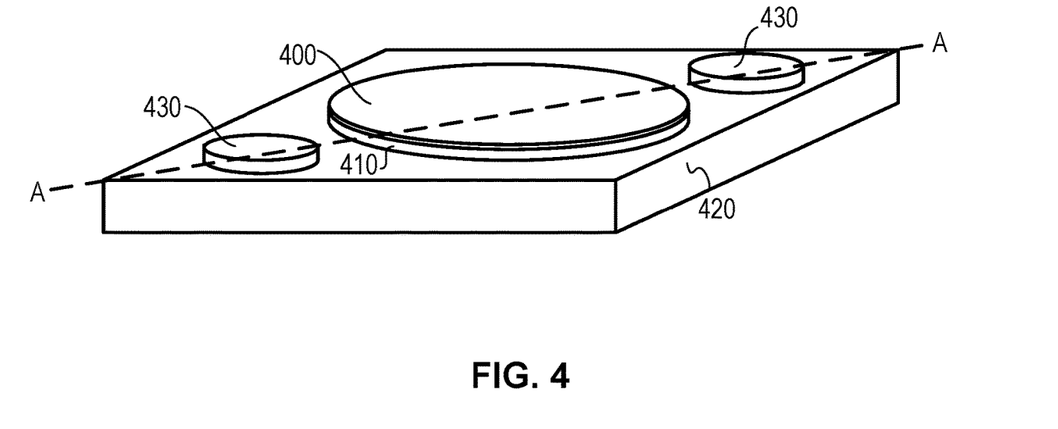
FIG. 4 shows a schematic of a substrate stage, according to some embodiments.

FIG. 4 shows a schematic of a substrate stage 400, according to some embodiments. In some embodiments, substrate stage comprises a substrate table 402, a support block 404, and one or more sensor structures 406. In some embodiments, substrate table 402 comprises a clamp to hold a substrate 408 (e.g., an electrostatic clamp). In some embodiments, each of one or more sensor structures 406 comprises a transmission image sensor (TIS) plate. The TIS plate is a sensor unit that comprises one or more sensors and/or markers for use in a TIS sensing system used for accurate positioning of the wafer relative to the position of a projection system (e.g., projection system PS, FIG. 1) and a mask (e.g., mask MA, FIG. 1) of a lithographic apparatus (e.g., lithographic apparatus 100, FIG. 1). While TIS plates are shown here for illustration, embodiments herein are not limited to any particular sensor. Substrate table 402 is disposed on support block 404. One or more sensor structures 406 are disposed on support block 404.

In some embodiments, substrate 408 is disposed on substrate table 402 when substrate stage 400 supports substrate 408.

The terms "flat," "flatness" or the like may be used herein to describe structures in relation to a general plane of a surface. For example, a bent or unleveled surface may be one that does not conform to a flat plane. Protrusions and recesses on a surface may also be characterized as deviations from a 'flat' plane.

The terms "smooth," "roughness" or the like, may be used herein to refer to a local variation, microscopic deviations, graininess, or texture of a surface. For example, surface roughness may refer to microscopic deviations of the surface profile from a mean line or plane. The deviations are generally measured (in unit of length) as an amplitude parameter, for example, root mean squared (RMS) or arithmetical mean deviation (Ra) (e.g., 1 nm RMS).

In some embodiments, the surface of the substrate tables mentioned above (e.g., wafer table WT in FIGS. 1A and 1B, substrate table 402 in FIG. 4) may be flat or burled. When the surface of a substrate table is flat, any particulates or contaminants stuck between the substrate table and a wafer will cause the contaminant to print through the wafer, causing lithography errors in its vicinity. Consequently, contaminants reduce device yield rates and increase production costs.

Disposing burls on substrate tables help to reduce the undesirable effects of a flat substrate table. When a wafer is clamped to a burled substrate table, empty spaces are available in the regions where the wafer does not contact the substrate table. The empty spaces function as pockets for contaminants so as to prevent printing errors. Another advantage is that contaminants that make it on the burls are more likely to become crushed due to the increased load caused by the burls. Crushing contaminants helps mitigate print-through errors as well. In some embodiments, the combined surface area of the burls can be approximately 1-5% of the surface area of the substrate table. Here, surface area of the burls refers to the surfaces that come into contact with the wafer (e.g., not including the side walls). And surface area of the substrate table refers to the span of surface of the substrate table where the burls reside (e.g., not including the lateral or back side of the substrate table). When the wafer is clamped onto the burled substrate table, the load is increased by 100 fold as compared to a flat substrate table, which is enough to crush most contaminants. Though the example here uses a substrate table, the example is not intended to be limiting. For example, embodiments of the present disclosure can be implemented on reticle tables, for a variety of clamping structures (e.g., electrostatic clamps, clamping membranes), and in a variety of lithographic systems (e.g., EUV, DUV).

Now, the burl-to-wafer interface governs the functional performance of the substrate table. When the surface of a substrate table is smooth, an adhesion force may develop between the smooth surface of the substrate table and the smooth surface of a wafer. The phenomenon where two smooth surfaces in contact cling together is known as wringing. Wringing can cause issues in device fabrication, for example, overlay issues due to high friction and in-plane stresses in the wafer (it is optimal to have the wafer glide easily during alignment). A method to reduce friction at the burl-to-wafer interface is to coat the burl using a low-friction coating (e.g., diamond-like carbon). However, in the presence of water (e.g., immersion lithography) the coating can polish away rather quickly. Another method to reduce friction at the burl-to-wafer interface is to roughen the burl-top surface to reduce the contact surface area. However, rough burl-tops do not retain their roughness for very long. The rougher the initial roughness of the burl-top, the faster it can polish and wear away.

Moreover, it has been observed that burled surfaces of substrate tables are susceptible to unusually rapid wear, particularly at the edges away from the center of the substrate table (i.e., uneven wear). Uneven wear causes a wafer to bend when clamped to the substrate table, which in turn reduces accuracy of lithographic placement of device structures, overlay drift over time, and the like. And the overall wear can reintroduce wringing issues and lead to decrease in imaging performance due to change in global shape of clamping surface.

To prevent frictional wear of the surface, surface characteristics of the substrate table can be manipulated. For example, designing nanostructures (e.g., nanopillars or fine burls) on the burl-top surface. That is, going from a randomized surface design (roughening) to a deterministic surface design. The term "fine burls" may be used herein to refer to the deterministic nanopillar design on the surface of the burls (e.g., coarse burls) described earlier. Embodiments of the present disclosure provide structures and methods for manipulating tribological properties of a surface of a substrate table.

Figure 5:
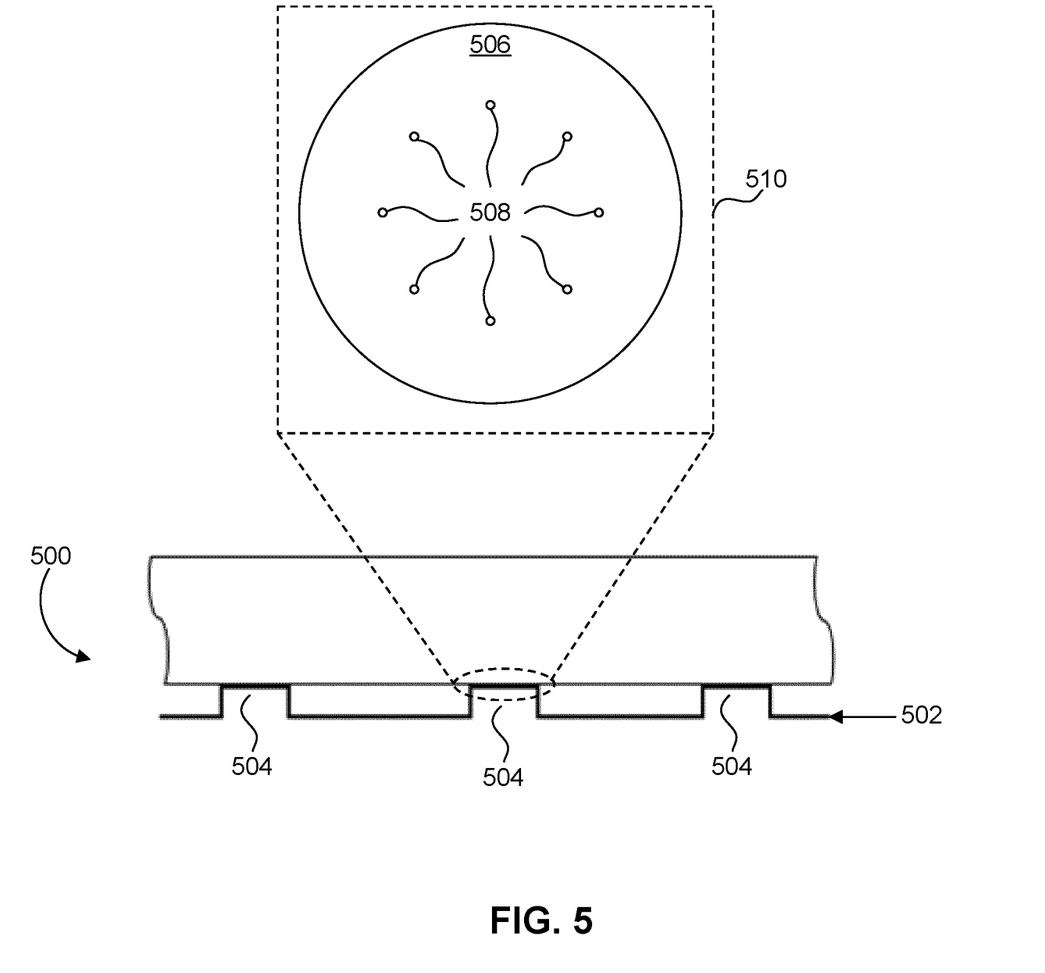
FIG. 5 shows a cross-sectional schematic of a region of a substrate table, according to some embodiments.

FIG. 5 shows a cross-sectional schematic of a region of a substrate table 500, according to some embodiments. Substrate table 500 comprises a surface 502 and coarse burls 504. Each of coarse burls 504 comprises a burl-top surface 506 and fine burls 508, which are shown in inset 510. Inset 510 is a top-down view of a coarse burl 504.

In some embodiments, coarse burls 504 are disposed on surface 502. Fine burls 508 are disposed on burl-top surface 506. Though FIG. 5 depicts coarse burls 504 and fine burls 508 as having circular areas, it should be appreciated that coarse burls 504 and fine burls 508 can have other areal geometries (e.g., square, ellipse, and the like). Also, though FIG. 5 depicts fine burls 508 as having a circular and/or octagonal arrangement, any number of fine burls 508 (including one) and any arrangement (e.g., grid or randomized distribution) across burl-top surface 506 can be used.

In some embodiments, each of coarse burls 504 has a width or diameter of approximately 100-1000 microns (dimension parallel to the plane of surface 502). Each of coarse burls 504 has a height of approximately 10-200, 10-150, or 10-100 microns (dimension perpendicular to plane of surface 502). Each of fine burls 508 has a width or diameter of approximately 1-15 microns. Each of fine burls 508 has a height of approximately 10-50, 20-40, or 20-30 nm. A distance between two of fine burls is approximately 50-200, 50-150, or 50-100 microns. Each of fine burls 508 comprise a contact area (to contact substrate 518) having a surface roughness of less than approximately 1 nm RMS.

Other dimensions for coarse burls 504 and/or fine burls 508 can be chosen. For example, dimensions for coarse burls 504 can be based on sizes of typical or expected contaminant particulates in a lithographic apparatus.

Contact surface area is a parameter that influences friction. Therefore, dimensions for coarse burls 504 and/or fine burls 508 can be based on a contact area to arrive at a designated friction.

In some embodiment, substrate table 500 is configured to support a substrate 518. Substrate table 500 can toggle between two states: engaged (clamped substrate) and disengaged (unclamped substrate). In the disengaged state, the load between burl-top surface 506 and substrate 518 is primarily due to gravity acting on substrate 518 (low load). In the low load state, substrate 518 comes into contact with fine burls 508 and not with burl-top surface 506. The dimensions of fine burls 508 described above improve the performance of substrate table 500 due to, e.g., having a relatively small contact area to reduce friction and a height designed to mitigate wear. That is, in some embodiments, the combined surface area of fine burls 508 can be approximately 1-5% of the surface area of burl-top surface 506. The effects of wear are reduced because the load is spread over a larger burl area at the medium loads, when most wear is expected to happen. The relation between load/pressure and burl contact area is discussed below in reference to FIG. 6. In a different comparison, the combined surface area of fine burls 508 can be approximately 0.01-0.025% of the surface area of substrate table 500 (the span of surface of the substrate table where the burls reside, e.g., not including the lateral or back side of the substrate table). The reduced friction allows substrate 518 to be translated with ease during alignments while also reducing in-plane stress on substrate 518. Additionally, fine burls 508 disrupt the plane of burl-top surface 506 enough to hinder wringing phenomena. That is, in some embodiments, fine burls 508 are configured to reduce wringing (or a pulling/adhesion force) between substrate table 500 and substrate 518. Consequently, the performance of substrate table 500 (e.g., overlay performance) can be enhanced. The reduction of wringing is due to the fact that fine burls 508 act as springs that peel the substrate off the surface between the fine burls (burl-top surface 506) when a clamping force is released.

Figure 7:
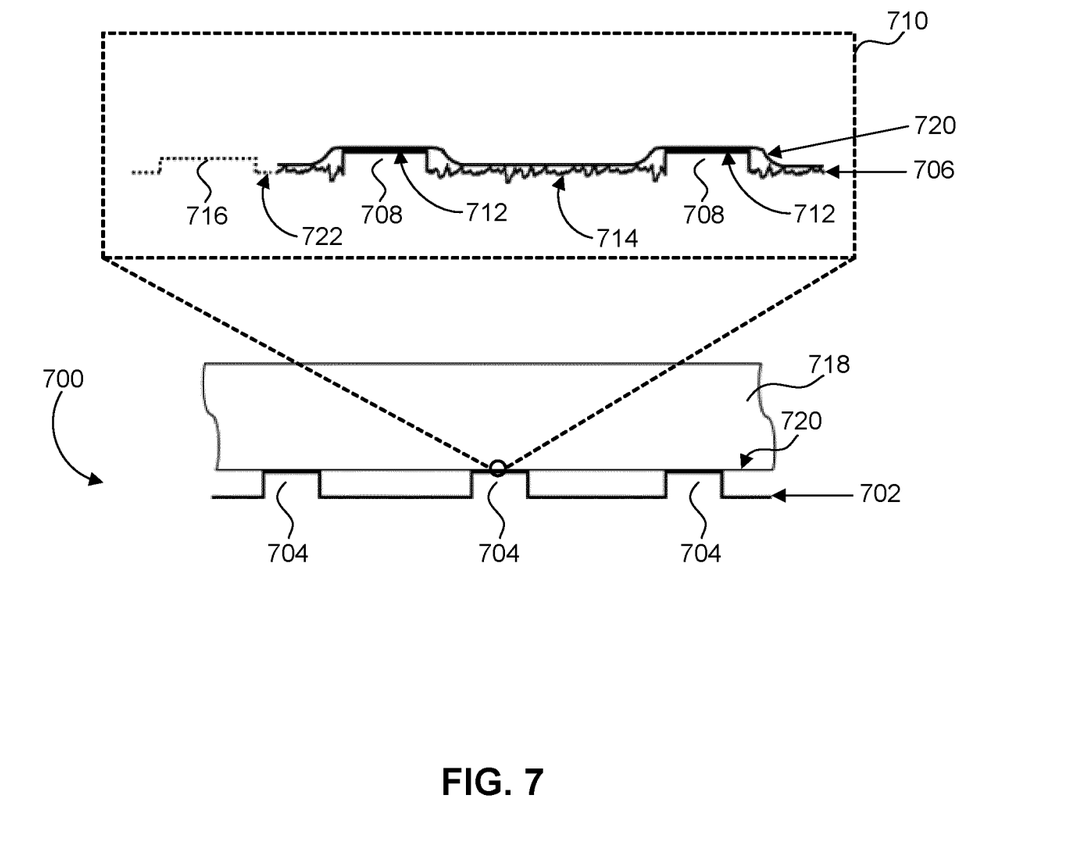
FIG. 7 shows a cross-sectional schematic of a region of a substrate table, according to some embodiments.

Conversely, the engaged state of substrate table 500 creates an increased load between burl-top surface 506 and substrate 518. At a small enough scale, any surface of a material can be thought of as elastic, compressible, or otherwise deformable (FIG. 7 depicts this behavior). The load can cause substrate 518 to deform and 'sink' into fine burls 508. If the heights of fine burls 508 are appropriately chosen, substrate 518 can come into contact with burl-top surface 506. The increased contact area vastly increases the friction between substrate table 500 and substrate 518. Consequently, substrate 518 can be securely held for undergoing lithographic processes.

In some embodiments, the height of fine burls 508 are selected based on a selected friction property. Fine burls 508 can enhance disengaging substrate 518. The height difference between burl-top surface 506 and fine burls 508 causes fine burls 508 to act like springs and push against substrate 518. Thus, substrate 518 can avoid becoming stuck to substrate table 500.

Figure 6:
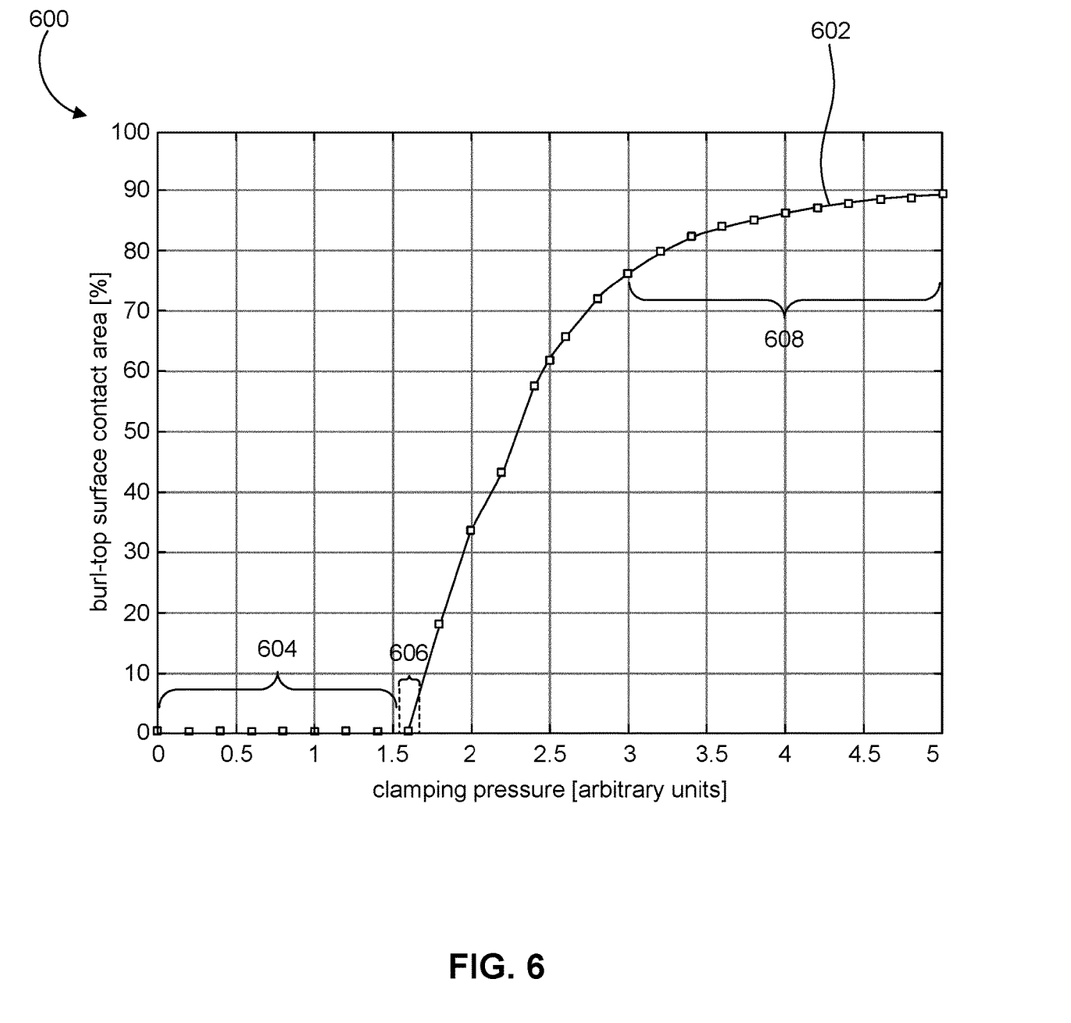
FIG. 6 shows a graph of burl-top surface contact area versus clamping pressure, according to some embodiments.

FIG. 6 shows a graph 600 of burl-top surface contact area versus clamping pressure, according to some embodiments. The vertical axis represents a percentage of burl-top surface area that is in actual contact with a substrate (e.g., burl-top surface 706 in contact with substrate 718, FIG. 7). The horizontal axis represents a clamping pressure or force applied to the substrate, in arbitrary units (A.U.). Plot line 602 represents a simulation of a measurement of actual contact area as the clamping force is varied (wringing effects are ignored). Tuning the fine burl height allows tuning of (a) a low-pressure contact area (0-1.6 A.U.; region 604), (b) an onset pressure of high contact area regime (1.6 A.U.; region 606), and (c) contact area at full clamping pressure (>3 A.U.; region 608).

The discussion so far has focused on nanopillars or fine burls that help reduce wringing, among a host of advantages. However, there may be situations where the presence of fine burls may not provide enough force to promote consistent detachment of a substrate from a burl-top surface. Embodiments of the present disclosure provide structures and methods for further manipulating tribological properties of a surface of a substrate table.

FIG. 7 shows a cross-sectional schematic of a region of a substrate table 700, according to some embodiments. Substrate table 700 comprises a surface 702 and coarse burls 704. Each of coarse burls 704 comprises a burl-top surface 706 and fine burls 708, which are shown in inset 710. Inset 710 is a cross-sectional view of a region of a coarse burl 704. Each of fine burls 708 comprises a contact surface 712. In some embodiments, burl-top surface 706 comprises a roughened area 714. In some embodiments, each of coarse burls 704 further comprises intermediate burls 716.

In some embodiments, coarse burls 704 are disposed on surface 702. Fine burls 708 and intermediate burls 716 are disposed on burl-top surface 706. The arrangement, shapes, and numbers of fine burls 708 and/or intermediate burls 716 can be as described in reference to fine burls 508 (FIG. 5) for similar reasons. Additionally, intermediate burls 716 can have a height that is different from a height of fine burls 708 (i.e., the heights are dissimilar). The differing heights, or hierarchal structure, can fulfill a function similar to a roughened area. Roughened area 714 is disposed among fine burls 708. The term "among" may be used herein to refer to positions between, close to in between, nearby, and/or in the general surrounding area. Therefore, roughened area 714 can be disposed between two of fine burls 708 or fill the entirety burl-top surface 706. In some embodiments, roughened area 714 can be divided into patches (e.g., a plurality of roughened areas 714) distributed between, close to in between, nearby, and/or in the general vicinity of fine burls 708.

In some embodiment, substrate table 700 is configured to support a substrate 718. Substrate surface 720 of substrate 718 is identified in FIG. 7 as the surface to come into contact with substrate table 700. The functions and interactions of substrate table 700 with substrate 718 can be as described above for substrate table 500 and substrate 518 (FIG. 5) for similar reasons. Each of fine burls 708 comprise a contact area (to contact substrate 718) having a surface roughness of less than approximately 1 nm RMS. Roughened area 714 can have a surface roughness of approximately 2-10, 2-8, or 3-5 nm RMS.

When substrate table 700 engages substrate 718, an increased load can cause substrate 718 to deform and 'sink' into fine burls 708. This is depicted by substrate surface 720 in inset 710. When disengaged, it is important for substrate table 700 to successfully release substrate 718. Wringing can cause untimely wear of fine burls 708, particularly toward the edges of substrate table 700 where substrate motion is largest during clamping/unclamping. Therefore, in some embodiments, roughened area 714 can contact substrate 718 when substrate table 700 engages substrate 718. In this scenario, the deformed substrate gains the advantages of having increased contact area with burl-top surface 706. The advantages are as described in reference to FIGS. 5 and 6. In contrast with burl-top surface 506 of FIG. 5, roughened area 714 enhances separation of substrate 718 from burl-top surface 706 when disengaging.

In some embodiments, intermediate burls 716 can be used in lieu of or in addition to roughened area 714 to enhance separation of substrate 718. Intermediate burls 716 are disposed among fine burls 708. The hierarchal structures (height differences) created by intermediate burls 716 can enhance separation by further interrupting the plane of burl-top surface 706 in regions between fine burls 708.

In some embodiments, each of coarse burls 704 further comprises a modified surface 722. Modified surface 722 can be disposed between two of fine burls 708 or fill the entirety burl-top surface 706. In some embodiments, modified surface 722 can be divided into patches (e.g., a plurality of modified surfaces 722) distributed between, close to in between, nearby, and/or in the general vicinity of fine burls 708.

In some embodiments, modified surface 722 has chemically modified low surface energy. The chemical modification can be achieved using, e.g., a chemical bath or rinse. The low surface energy reduces an adhesion force between substrate table 700 and substrate 718. The reduced adhesion force enhances the separation of substrate 718 from substrate table 700 when disengaged. Modified surface 722 can be implemented in lieu of or in addition to roughened area 714 and/or intermediate burls 716.

Figure 8:
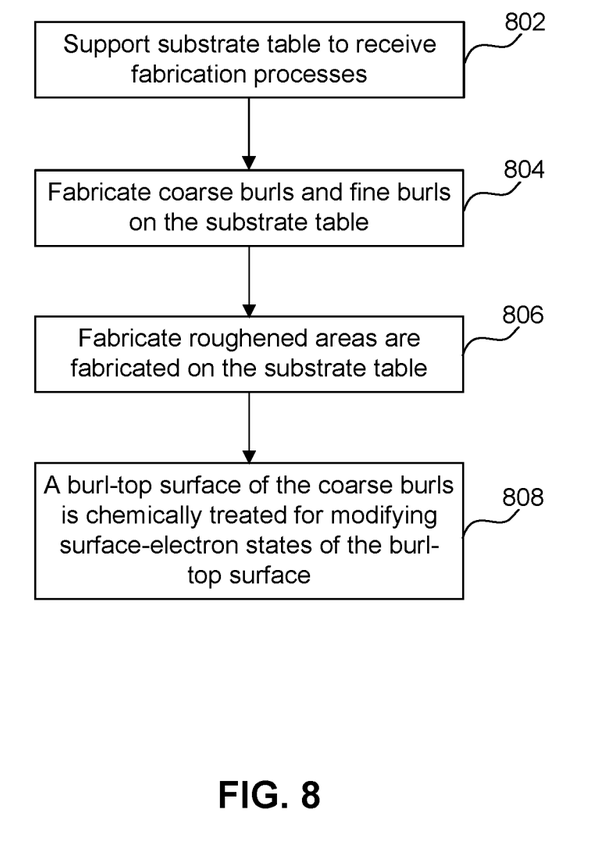
FIG. 8 shows method steps for fabricating a substrate table, according to some embodiments.

FIG. 8 shows method steps for fabricating a substrate table, according to some embodiments. In step 802, a substrate table is supported to receive fabrication processes. In step 804, coarse burls and fine burls are fabricated on the substrate table. Fabricating the coarse burls and the fine burls comprises disposing the fine burls on burl-top surfaces of the coarse burls. In step 806, roughened areas and/or intermediate burls are fabricated on the substrate table. Fabricating the roughened areas and/or intermediate burls further comprises disposing the roughened areas and/or intermediate burls among the fine burls. Fabricating the roughened areas further comprises generating the roughened areas using laser ablation, etching (e.g., reactive ion-etching), and/or mechanical procedures (e.g., coarse polish). Fabricating coarse, fine, and/or intermediate burls further comprises fabricating via lithographic processes described herein. In step 808, the burl-top surface is chemically treated for achieving a low surface energy of the burl-top surface (e.g., suppressed dangling bonds). The chemical treatment or modification can be achieved, for example, by submersing or rinsing the substrate table using a chemical substance (e.g., acid, solvent, base). The low surface energy reduces an adhesion force between the substrate table and a substrate.

The method steps of FIG. 8 can be performed in any conceivable order and it is not required that all steps be performed. For example, Step 808 can be performed in lieu of or in addition to step 806. The coarse, fine, and/or intermediate burls, and the roughened areas can be fabricated simultaneously, not simultaneously, and/or any order. In another example, step 806 can be optional (e.g., the burl-top surface can have the same roughness as the surface of the fine burls). The arrangement, shapes, and dimensions of the structures on the substrate table (e.g., coarse and of fine burls, roughened areas, etc.) can be as described above in reference to FIGS. 5 and 7.

In general, a deterministically structured burl-top (e.g., fine burls) allows breaking the traditional compromise between good wear performance and good friction performance. Low friction is desired when loading a wafer to ensure the wafer is stress free when fully clamped. High friction is desired when the wafer is fully clamped such that the wafer does not move during acceleration of the wafer table (or due to wafer heating). It is desirable to have stable surfaces that perform over numerous (e.g., thousands, tens of thousands) wafer loads, where stability is concerned with preservation of friction characteristics and global flatness of the wafer table. Low friction can be achieved by limiting surface area of contact. Limiting surface area of contact can be achieved by surface roughening or small-diameter burls. Both can lead to higher peak loads, and therefore faster material removal, change in global shape, and/or decrease in roughness (changes friction). Embodiments of the present disclosure have described how the area and heights of fine burls can be tuned to achieve desired frictional and wear resistance without compromise. By tuning the area and heights of fine burls, it is possible to achieve low surface area and low friction at low loads, low-to-intermediate friction and low wear at medium loads (where most wear occurs), and high friction and stability at high loads by making contact with the entire burl-top surface.

The embodiments may further be described using the following clauses:

1. A substrate table for supporting a substrate, the substrate table comprising:
   a surface; and
   coarse burls disposed on the surface, wherein each of the coarse burls comprises:
   a burl-top surface; and
   fine burls disposed on the burl-top surface and configured to contact the substrate when the substrate table supports the substrate.
2. The substrate table of clause 1, wherein:
   each of the fine burls comprises a contact surface configured to contact the substrate; and
   the contact surface has a surface roughness of less than approximately 1 nm RMS.
3. The substrate table of clause 1, wherein each of the coarse burls has a width of approximately 100-1000 microns and a height of approximately 10 to 200 microns.
4. The substrate table of clause 1, wherein each of the fine burls has a width of approximately 1 to 10 microns.
5. The substrate table of clause 1, wherein the fine burls have a height of approximately 10-50 nm.
6. The substrate table of clause 1, wherein a distance between two of the fine burls is approximately 50-200 microns.
7. The substrate table of clause 1, wherein a total surface area of contact areas of the fine burls is less than 0.1% relative to an overall surface area of the substrate table.
8. The substrate table of clause 1, wherein:
   the each of the coarse burls further comprises intermediate fine burls disposed among the fine burls on the burl-top surface; and
   a height of the fine burls and a height of the intermediate fine burls are dissimilar.
9. The substrate table of clause 1, wherein the burl-top surface comprises a roughened area disposed among the fine burls.
10. The substrate table of clause 9, wherein the roughened area is configured to contact the substrate when the substrate table engages the substrate.
11. The substrate table of clause 9, wherein the roughened area has a surface roughness of approximately 2-8 nm RMS.
12. The substrate table of clause 1, wherein:
    the burl-top surface comprises a modified surface having chemically modified low surface energy; and
    the modified surface is configured to reduce an adhesion force between the substrate table and the substrate.
13. A lithographic apparatus comprising:
    an illumination system configured to produce a beam of radiation;
    a support configured to support a patterning device configured to impart a pattern on the beam;
    a projection system configured to project the patterned beam onto a substrate; and
    a substrate table configured to support the substrate, the substrate table comprising:
    a surface; and
    coarse burls disposed on the surface, wherein each of the coarse burls comprises:
    a burl-top surface; and
    fine burls disposed on the burl-top surface and configured to contact the substrate when the substrate table supports the substrate.
14. The lithographic apparatus of clause 13, wherein the fine burls have a height of approximately 10-50 nm.
15. The lithographic apparatus of clause 13, wherein the burl-top surface comprises a roughened surface disposed among the fine burls.
16. The lithographic apparatus of clause 13, wherein the roughened surface is configured to contact the substrate when the substrate table engages the substrate.
17. The lithographic apparatus of clause 16, wherein the roughened surface has a surface roughness of approximately 2-8 nm RMS.
18. A method of fabricating a substrate table, the method comprising:
    supporting the substrate table to receive fabrication processes; and
    fabricating coarse burls and fine burls on the substrate table, wherein the fabricating the coarse burls and the fine burls comprises disposing the fine burls on burl-top surfaces of the coarse burls.
19. The method of clause 18, further comprising fabricating roughened areas on the substrate table, wherein the fabricating the roughened areas comprises disposing the roughened areas among the fine burls on the burl-top surfaces.

20. The method of clause 19, wherein the fabricating the roughened surfaces further comprises generating the roughened areas using laser ablation.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A substrate table for supporting a substrate, the substrate table comprising:
 a surface; and
 coarse burls disposed on and spaced across the surface, wherein each of the coarse burls comprises:
  a burl-top surface; and
  deterministic fine burls disposed on the burl-top surface and configured to contact the substrate when the substrate table supports the substrate, wherein the burl-top surface comprises a roughened area disposed among the fine burls.

2. The substrate table of claim 1, wherein:
 each of the fine burls comprises a contact surface configured to contact the substrate; and
 the contact surface has a surface roughness of less than approximately 1 nm RMS.

3. The substrate table of claim 1, wherein each of the coarse burls has a width of approximately 100 to 1000 microns and a height of approximately 10 to 200 microns.

4. The substrate table of claim 1, wherein each of the fine burls has a width of approximately 1 to 10 microns.

5. The substrate table of claim 1, wherein the fine burls have a height of approximately 10 to 50 nm.

6. The substrate table of claim 1, wherein a distance between two of the fine burls is approximately 50 to 200 microns.

7. The substrate table of claim 1, wherein a total surface area of contact areas of the fine burls is less than 0.1% relative to an overall surface area of the substrate table.

8. The substrate table of claim 1, wherein:
 each of the coarse burls further comprises intermediate fine burls disposed among the fine burls on the burl-top surface; and
 a height of the fine burls and a height of the intermediate fine burls are dissimilar.

9. The substrate table of claim 1, wherein the roughened area is configured to contact the substrate when the substrate table engages the substrate.

10. The substrate table of claim 1, wherein the roughened area has a surface roughness of approximately 2 to 8 nm RMS.

11. The substrate table of claim 1, wherein:
the burl-top surface comprises a modified surface having chemically modified low surface energy; and
the modified surface is configured to reduce an adhesion force between the substrate table and the substrate.

12. A lithographic apparatus comprising:
a support configured to support a patterning device configured to impart a pattern on a beam of radiation;
a projection system configured to project the patterned beam onto a substrate; and
a substrate table configured to support the substrate, the substrate table comprising:
a surface; and
coarse burls disposed on and spaced across the surface, wherein each of the coarse burls comprises:
a burl-top surface; and
deterministic fine burls disposed on the burl-top surface and configured to contact the substrate when the substrate table supports the substrate, wherein the burl-top surface comprises a roughened surface disposed among the fine burls.

13. The lithographic apparatus of claim 12, wherein the fine burls have a height of approximately 10 to 50 nm.

14. The lithographic apparatus of claim 12, wherein the roughened surface is configured to contact the substrate when the substrate table engages the substrate.

15. The lithographic apparatus of claim 12, wherein the roughened surface has a surface roughness of approximately 2 to 8 nm RMS.

16. A method of fabricating a substrate table, the method comprising:
supporting the substrate table to receive fabrication processes; and
fabricating coarse burls and fine burls on and spaced across the substrate table, wherein the fabricating the coarse burls and the fine burls comprises disposing deterministic fine burls on each burl-top surface of the coarse burls,
wherein the fabricating comprises fabricating roughened areas on the substrate table, and wherein the roughened areas are disposed among the fine burls on the burl-top surfaces.

17. The method of claim 16, wherein the fabricating the roughened surfaces further comprises generating the roughened areas using laser ablation.

18. The lithographic apparatus of claim 12, wherein:
each of the fine burls comprises a contact surface configured to contact the substrate; and
the contact surface has a surface roughness of less than approximately 1 nm RMS.

19. The lithographic apparatus of claim 12, wherein each of the fine burls has a width of approximately 1 to 10 microns.

20. The lithographic apparatus of claim 12, wherein a distance between two of the fine burls is approximately 50 to 200 microns.

* * * * *